(12) United States Patent
Li et al.

(10) Patent No.: US 8,949,080 B2
(45) Date of Patent: Feb. 3, 2015

(54) METHODS OF DESIGNING INTEGRATED CIRCUITS AND SYSTEMS THEREOF

(75) Inventors: Kuo-Tsai Li, San Jose, CA (US); Paul Chang, Fremont, CA (US); Andy Chang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 793 days.

(21) Appl. No.: 12/862,991

(22) Filed: Aug. 25, 2010

(65) Prior Publication Data

US 2012/0053923 A1    Mar. 1, 2012

(51) Int. Cl.
*G06F 17/50*    (2006.01)

(52) U.S. Cl.
CPC ........ *G06F 17/5036* (2013.01); *G06F 17/5081* (2013.01); *G06F 17/5068* (2013.01)
USPC ................... 703/2; 703/5; 716/106; 716/110; 257/499

(58) Field of Classification Search
CPC .. G06F 17/5068; G06F 11/00; G06F 17/5081
USPC ............ 703/13, 22, 2, 5; 716/6, 19, 106, 110; 713/152; 257/499
See application file for complete search history.

(56) References Cited

U.S. PATENT DOCUMENTS

| | | | |
|---|---|---|---|
| 7,870,381 B2 * | 1/2011 | Hekmatpour et al. | 713/152 |
| 8,037,575 B2 * | 10/2011 | Cheng et al. | 16/54 |
| 8,336,002 B2 * | 12/2012 | Chang et al. | 716/52 |
| 8,372,742 B2 * | 2/2013 | Cheng et al. | 438/622 |
| 8,701,055 B1 * | 4/2014 | Lee et al. | 716/54 |
| 2005/0206957 A1 | 9/2005 | Chia et al. | |
| 2006/0184907 A1 | 8/2006 | Hirano et al. | |
| 2007/0070737 A1 | 3/2007 | Fischer | |
| 2007/0201442 A1 * | 8/2007 | Hekmatpour et al. | 370/356 |
| 2007/0266356 A1 * | 11/2007 | Chang et al. | 716/6 |
| 2009/0007035 A1 | 1/2009 | Su et al. | |
| 2009/0206957 A1 | 8/2009 | Hiroshima et al. | |
| 2009/0222785 A1 * | 9/2009 | Cheng et al. | 716/19 |
| 2009/0326873 A1 | 12/2009 | Wang et al. | |
| 2011/0204470 A1 * | 8/2011 | Cheng et al. | 257/499 |

* cited by examiner

*Primary Examiner* — Thai Phan
(74) *Attorney, Agent, or Firm* — Lowe Hauptman & Ham, LLP

(57) ABSTRACT

A method of designing an integrated circuit includes performing a pre-layout simulation of the integrated circuit. The pre-layout simulation is performed using a netlist generated from a process design kit (PDK) file. The PDK file includes a plurality of device model cards that are assigned to plurality of devices. The plurality of devices include a first device having at least one parasitic diode that is associated with at least one isolation well, the PDK file including information of the at least one parasitic diode. A design layout of the integrated circuit corresponding to a result of the pre-layout simulation is generated.

19 Claims, 5 Drawing Sheets

METHODS OF DESIGNING INTEGRATED CIRCUITS AND SYSTEMS THEREOF

TECHNICAL FIELD

The present disclosure relates generally to the field of semiconductor circuits, and more particularly, to methods of designing integrated circuits and systems thereof.

BACKGROUND

Semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

While features of integrated circuits shrink, modeling the impact of physical/layout effects up front in integrated circuit designs becomes popular. For integrated circuit designs, process design kits (PDKs) or process access kits (PAKs) have been commercially used to build up the integrated circuits. Generally, PDKs include geometric descriptions and device models of devices, such as transistors, diodes, resistors, capacitors, etc. Circuit design engineers translate PDKs to transistor netlists and/or gate-level netlists for circuit simulations. Based on the simulation results, circuit design engineers predict and/or modify the designs of the integrated circuits.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION OF THE DISCLOSURE

Figure 1:
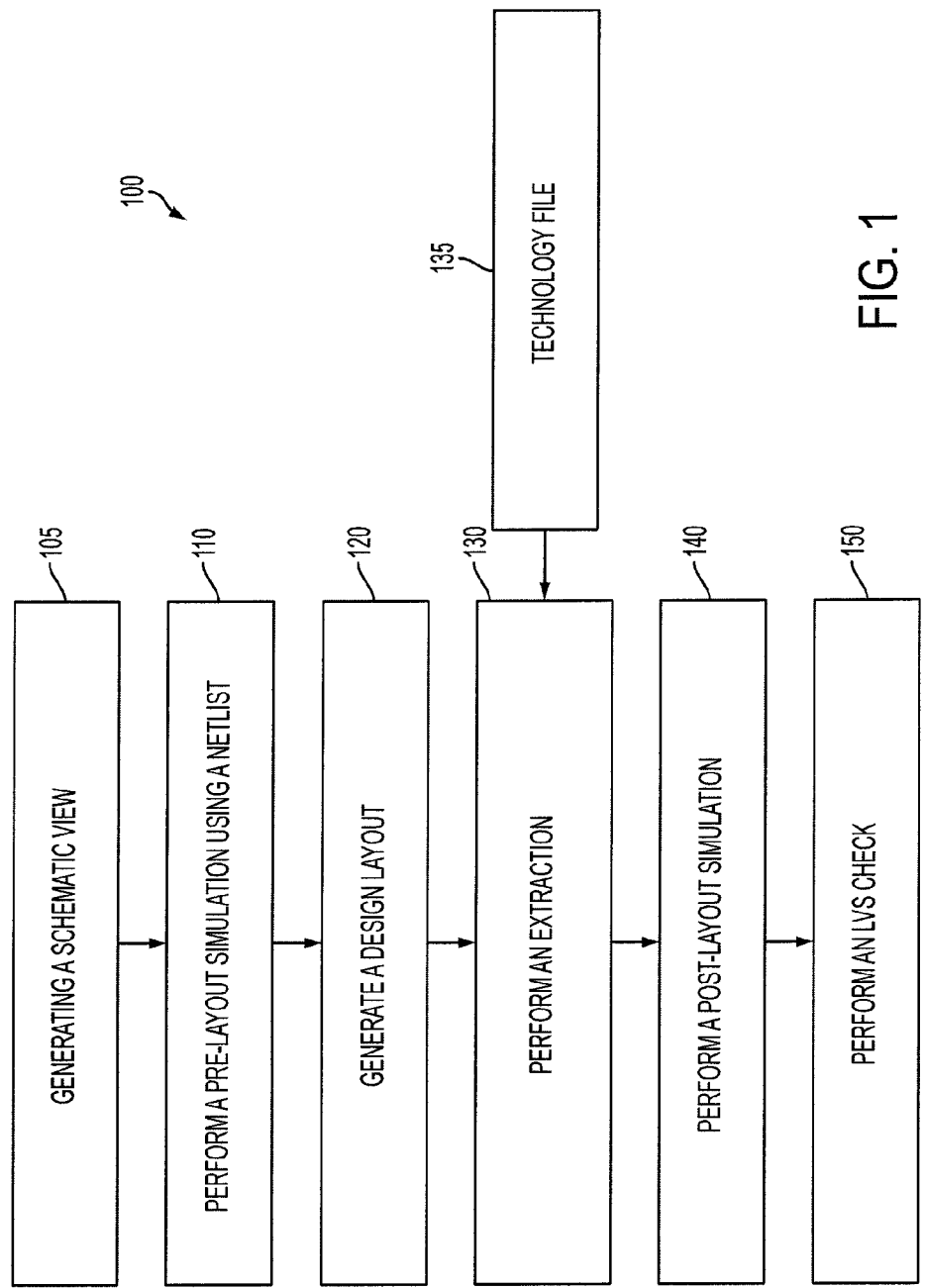
FIG. 1 is a schematic flowchart illustrating an exemplary method of designing an integrated circuit.

Generally, a PDK includes an intellectual property (IP) library. The IP library may include process models and design kits in appropriate technology file formats for use by circuit designers. The PDK is used to perform various simulations of integrated circuits up front manufacturing.

For example, a metal-oxide-semiconductor (MOS) transistor is designed with four terminals coupled to the source, drain, gate, and bulk of the MOS transistor. The PDK has the information associated with the four terminals. To achieve a desired electrical isolation, the MOS transistor may be formed and surrounded by an isolation structure, e.g., an implantation isolation well. The implantation isolation well in the integrated circuit is also coupled with a voltage terminal. The implantation isolation well and its neighboring semiconductor, e.g., substrate or well, resemble parasitic diodes in the integrated circuit.

It is found that the conventional PDK does not have electrical characteristics and/or geometric dimensions of parasitic diodes. The omission of the parasitic diodes associated with the isolation well in the PDK may compromise the pre-layout simulation result from which geometric dimensions of devices are used for a design layout.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled with or to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic flowchart illustrating an exemplary method of designing an integrated circuit. In some embodiments, the integrated circuit can be a digital circuit, an analog circuit, a mixed-signal circuit, a static random access memory (SRAM) circuit, an embedded SRAM circuit, dynamic random access memory (DRAM) circuit, an embedded DRAM circuit, a non-volatile memory circuit, e.g., FLASH, EPROM, $E^2$PROME, a field-programmable gate circuit, or any suitable integrated circuit.

Referring to FIG. 1, a method 100 of designing an integrated circuit can include performing a pre-layout simulation using a netlist (Step 110). In some embodiments, the pre-layout simulation can be performed on a pre-layout simulator, such as HSPICE® commercially available from SYNOPSYS, Inc. (San Jose, Calif.), SPECTRE® commercially available from CADENCE DESIGN SYSTEMS, Inc. (San Jose, Calif.), or any commercially available pre-layout simulator. The pre-layout simulation can be performed using a netlist file that is generated from a process design kit (PDK) file. The PDK file can be used to generate a netlist for the pre-layout simulation. In some embodiments, the netlist can be referred to as a transistor netlist, e.g., a pre-layout transistor netlist, or a gate-level netlist.

In some embodiments, the PDK file can include a plurality of device model cards that are assigned to respective devices. For example, the devices can include an N-type metal-oxide-semiconductor field effect transistor (MOSFET), a P-type MOSFET, a double-diffused MOS (DMOS) transistor, a complementary MOS (CMOS) transistor, a p/n junction diode, a resistor, a capacitor, an inductor, a bipolar transistor, a high-voltage (HV) device, a device formed by a HV Bipolar-CMOS-DMOS (HV BCD) process, and/or other semiconductor devices. The device model cards can include various dimensional parameters, device models, terminals, and/ or other electrical parameters. The dimensional parameters can include at least one of length, width, depth, thickness, area, perimeter, and/or other spatial parameters of each device.

In some embodiments, at least one of the devices can have at least one parasitic diode that is associated with at least one isolation well. The term "associated with" here can mean that the at least one parasitic diode resembles the at least one isolation well adjoining another semiconductor structure. The another semiconductor structure can be, for example, a well, a substrate, an isolation well, a high-voltage isolation well, or any semiconductor structure having a dopant type that is opposite to that of the at least one isolation well.

Figure 2A:
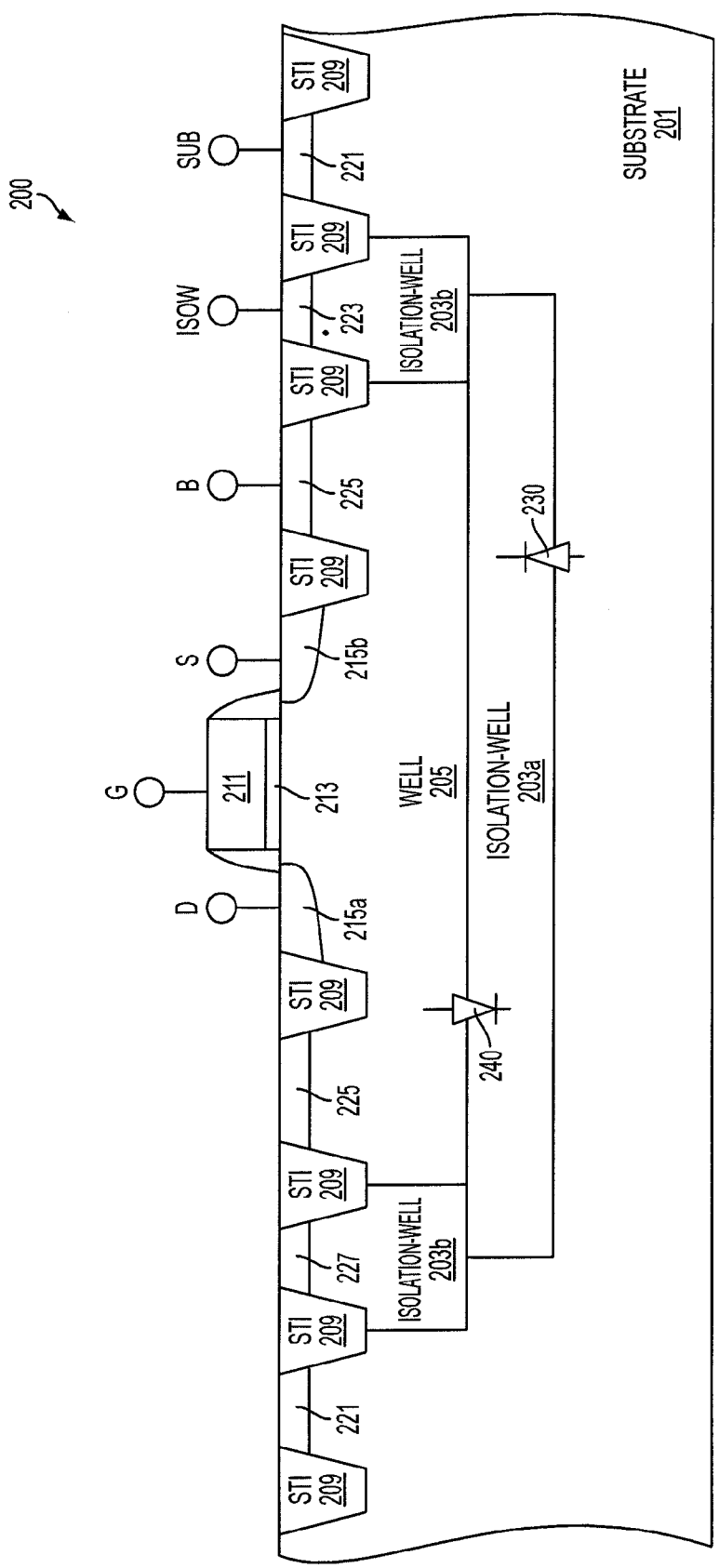
FIG. 2A is a schematic cross-sectional view of an exemplary transistor that is formed on and/or within a substrate.

For example, FIG. 2A illustrates a schematic cross-sectional view of a transistor 200 that is formed on and/or within a substrate 201. The substrate 201 can be electrically coupled with a node SUB through a doped region 221 that has the same dopant type as the substrate 201. The transistor 200 can have a gate electrode 211 that is disposed over a gate dielectric layer 213. A drain 215a and a source 215b can be disposed in a well 205. The gate electrode 211, the drain 215a, and the source 215b can be electrically coupled with nodes G, D, and S, respectively. The well 205 can be electrically coupled with a node B through a doped region 225 that has the same dopant type as the well 205. The well 205 is electrically isolated from the substrate 201 by at least one isolation well, e.g., isolation wells 203a and 203b. The isolation well 203a can be disposed below the well 205. The isolation well 203 can be disposed around the sidewall of the well 205. The isolation wells 203a and 203b can be electrically coupled with a node ISOW through a doped region 223 that has the same dopant type as the isolation wells 203a and 203b. The nodes G, D, S, B, SUB, and ISOW can be coupled with various voltages levels for operating the transistor 200.

As noted, the isolation wells 203a and 203b have a dopant type that is opposite to that of the substrate 201 and the well 205. Due to the different dopant types, the transistor 200 can have parasitic diodes 230 and 240, which resemble the effects of substrate 201 adjoining the isolation wells 203a-203b, and the well 205 adjoining the isolation wells 203a-203b, respectively. In some embodiments using an NMOSFET, the substrate 201 is a P-type substrate. The well 205 is a P-type well. The isolation well 203a can be referred to as a deep N-type isolation well. The isolation well 203b can be referred to as N-type isolation well.

As noted, the PDK file can include information of the at least one parasitic diode. In some embodiments, the information can include various parameters, device models, terminals, and/or other electrical parameters of the at least one parasitic diode. The parameters can include at least one of length, width, depth, thickness, area, perimeter, and/or other spatial parameters of the at least one parasitic diode.

The information of the at least one parasitic diode can be embedded in, or separated from, the device model card of the device that carries the at least one parasitic diode. In some embodiments using the transistor 200, the PDK file can include the device model card that is assigned to the transistor 200. Thus, the device model card of the transistor 200 can also include the information of the parasitic diodes 230 and 240. For example, a portion of the device model card may be described as follows:

.subckt nch_dnw_6t D G S B ISOW SUB
...

-continued

D1 SUB ISOW dnwsub pw_area pw_pj

D2 B ISOW pwdnw dnw_area dnw_pj

Wherein "nch_dnw_6t" represents the model name of the transistor 200. "D, G, S, B, ISOW, and SUB" represent the nodes that are electrically coupled with the transistor 200 as shown in FIG. 2A. "dnwsub" represents the model name of the parasitic diode 230. "SUB and ISOW" represent the nodes that are electrically coupled with the parasitic diode 230. "pwdnw" represents the model name of the parasitic diode 240. "B and ISOW" represent the nodes that are electrically coupled with the parasitic diode 230.

In some embodiments, the step 110 of performing the pre-layout simulation can use minimum rules of a design rule associated with a specific technology node, e.g., 40-nm (nanometer) technology node, 28-nm technology node, or any other technology node. The minimum rules can be applied in the device model cards for generating device characteristics, e.g., resistances, capacitances, currents, I-V (current vs. voltage) curves, current gains, voltage gain, and/or other device characteristics. In other embodiments, attributes of the devices that are larger than the minimum may be applied to the device model cards for generating the device characteristics. In still other embodiments, a mixture of the minimum rules and the large attributes can be applied to the device model cards for generating the device characteristics. Since the minimum rules and the large attributes here are used merely for the pre-layout simulation, the minimum rules and the desired attributes can be referred to as estimated dimensional parameters.

In some embodiments, the parasitic diode 230 can resemble the effects of isolation wells 203a-203b adjoining the substrate 201 in which the isolation wells 203a-203b are disposed. The information of the parasitic diode 230 can include at least one of an estimated length, an estimated width, an estimated perimeter, and an estimated area of the isolation wells 203a-203b.

In other embodiments, the parasitic diode 240 can resemble the effects of well 205 adjoining the isolation wells 203a-203b. The information of the parasitic diode 240 can include at least one of an estimated length, an estimated width, an estimated perimeter, and an estimated area of the well 205.

In some embodiments, the step 110 of performing the pre-layout simulation for the integrated circuit can generate a pre-layout simulation result. The pre-layout simulation result can include electrical and/or functional characteristics that are subjected to a behavior check and/or a functional check. For example, the behavior check can include checking if electrical characteristics, e.g., I-V curves, current gains, etc, of the integrated circuit meet a predetermined electrical specification. The functional check can include checking if the voltage state "0" or "1" of input nodes and output nodes of device components of the integrated circuit meets a predetermined functional specification. After the pre-layout simulation result passes the behavior check and/or the functional check, the process can proceed to layout the integrated circuit.

Figure 2B:
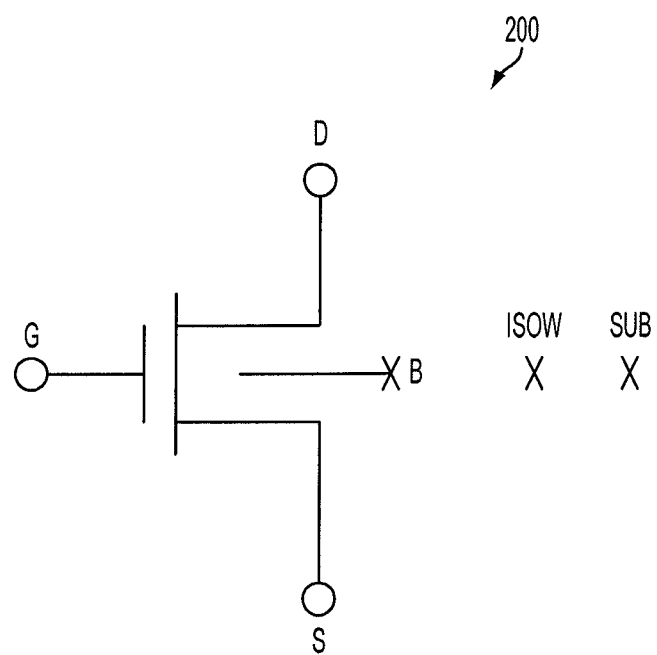
FIG. 2B is a schematic view of the exemplary transistor shown in FIG. 2A.

Referring again to FIG. 1, the method 100 can include generating schematic netlists of the devices by using the PDK file (step 105). The step 105 can be performed on a platform, such as VIRTUOSO® commercially available from CADENCE DESIGN SYSTEMS, Inc. (San Jose, Calif.). In some embodiments, a schematic netlist of a device that is associated with at least one isolation well can includes at least one node that is electrically coupled with the at least one isolation well. For example, the transistor 200 (shown in FIG. 2A) is associated with the isolation wells 203a and 203b. In some embodiments, a schematic view of the transistor 200 can be illustrated in FIG. 2B. In FIG. 2B, the schematic view of the transistor 200 shows the nodes D, G, S, and B that are electrically coupled with the drain 215a, gate 211, source 215b, and well 205 (shown in FIG. 2A), respectively. The schematic view of the transistor 200 also shows the nodes ISOW and SUB that are electrically coupled with the isolation wells 203a-203b and the substrate 201, respectively. In the embodiment, a portion of the schematic netlist of the transistor 200 can be described as below:

nch_dnw_6t D G S B ISOW SUB

In some embodiments, the information of the parasitic diodes 230 and 240 can be embedded in the device model card that is assigned to the transistor 200. In at least this embodiment, the schematic view of the transistor 200 is free from including the schematic views of the parasitic diodes 230 and 240.

Referring to FIG. 1, the method 100 can include generating a design layout (step 120). In some embodiments, the design layout may be generated as a Graphic Database System (GDS) file (e.g., a GDSII file). The design layout can include a database file comprising various layers that are drawn to represent the integrated circuit. The step 120 of generating the design layout of the integrated circuit can correspond to the simulation result of the pre-layout simulation. For example, if the pre-layout simulation passes the behavior check and/or the function check, the minimum rule and/or large attributes of the devices can be used to generate the design layout of the integrated circuit. In some embodiments, the step 120 of generating the design layout can be performed on a platform, such as VIRTUOSO® commercially available from CADENCE DESIGN SYSTEMS, Inc. (San Jose, Calif.).

Figure 2C:
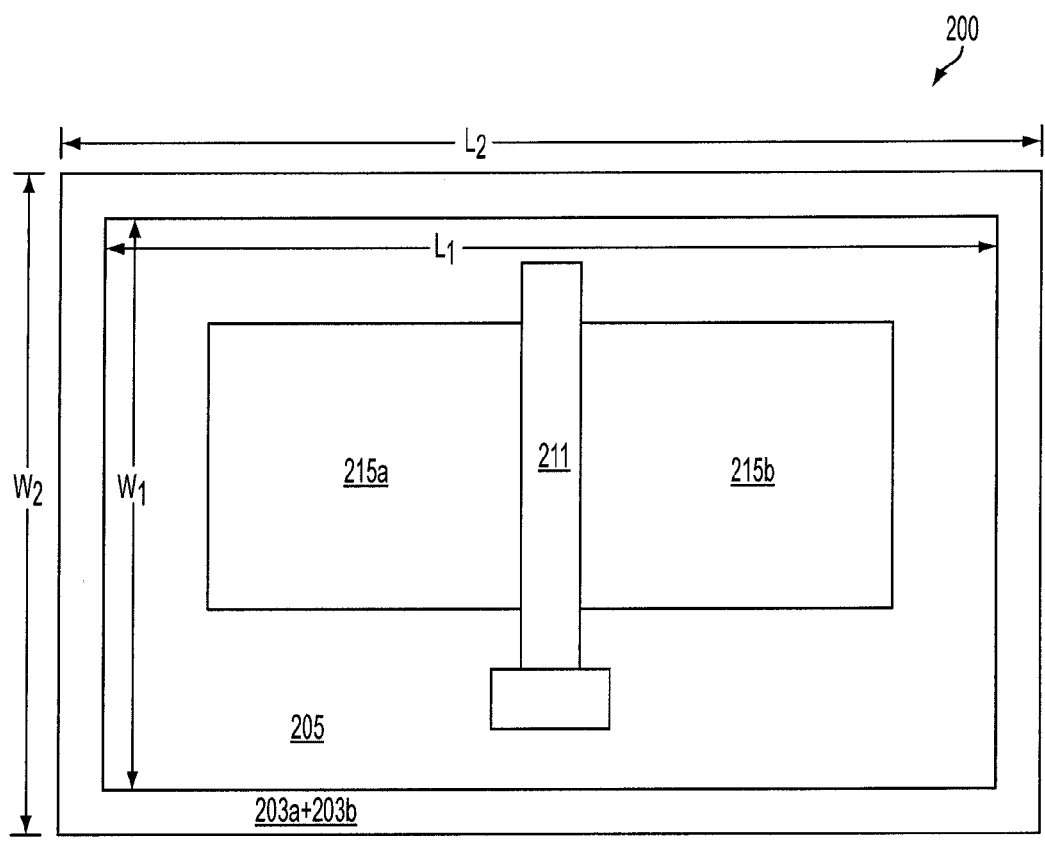
FIG. 2C is a schematic drawing illustrating layers of the exemplary transistor shown in FIG. 2A.

In some embodiments using the transistor 200, partial layers of the design layout of the transistor 200 can be shown in FIG. 2C. FIG. 2C is a schematic drawing illustrating layers of the isolation wells 203a-203b, the well 205, the gate electrode 211, the drain 215a, and the source 215b of the transistor 200. Each layer can have respective attributes, e.g., length, width, area, perimeter, and/or other dimensional parameters. For example, the well 205 can have a length $L_1$ and a width $W_1$ and the isolation wells 203a-203b can have a length $L_2$ and a width $W_2$. The areas and perimeters of the well 206 and the isolation wells 203a-203b can be derived from the lengths and widths. It is noted that the layers described above in conjunction with FIG. 2C are merely exemplary. In some embodiments, the design layout of the transistor 200 can include layers of contacts, vias, metal lines, and/or other structure layers.

Referring to FIG. 1, the method 100 can include performing an extraction (step 130). The step 130 of performing the extraction can include a layout parasitic extraction (LPE) and/or a resistance-capacitance (RC) extraction. The LPE can be a layout parameter extraction from the design layout for transistors, resistors, capacitors, inductors, and/or other semiconductor devices. The RC extraction can extract electrical characteristics from the database file of the design layout. In some embodiments, the layout parameters and/or electrical characteristics can be provided in a technology file 135. In the technology file 135, dimensional characteristics of devices can be extracted from the database file of the design layout. The extracted dimensional characteristics can be applied to various device models for generating the electrical characteristics. In some embodiments, the electrical characteristics can include capacitances and resistances in the electronic devices and on the various interconnects (also generally referred to as "nets") that electrically connect the aforementioned devices.

In some embodiments, the step 130 can include substantially nulling at least one electrical characteristic of the at least one parasitic diode at a device level. The term "substantially nulling at least one electrical characteristic of the at least one parasitic diode at a device level" means that the electrical characteristics of the at least one parasitic diode is set to or substantially equal to "0" at the device level, such that the electronic characteristics of the at least one parasitic diode does not affect a subsequent post-layout simulation.

For example, the transistor 200 described above in conjunction with FIGS. 2A-2C is used. As noted, at the device level the device model card can include the information of the transistor 200 and the parasitic diodes 230-240 as shown below:

.subckt nch_dnw_6t *D G S B ISOW SUB*

...

D1 *SUB ISOW dnwsub* pw_area pw_pj

D2 *B ISOW pwdnw* dnw_area dnw_pj

To substantially null the electrical characteristics of the parasitic diodes 230 and 240, the technology file 135 can, in some embodiments, include:

D1 set pw_area=0 pw_pj=0

D2 set dnw_area=0 dnw_pj=0

Wherein the areas and the perimeters of the diodes 230 and 240 are set to 0. By nulling the areas and perimeters of the parasitic diodes 230 and 240, the electrical characteristics of the parasitic diodes 230 and 240 at the device level are nullified. The substantially nulling step can be helpful if multiple devices share the same isolation well.

For example, additional transistors (not shown) share the same isolation wells 203a-203b and the well 205 with the transistor 200. The additional transistors can each have respective parasitic diodes at the device level. Contrary to the device level, the isolation wells 203a, 203b and the well 205 only carry the parasitic diodes 230 and 240 at the design layout level. If the electrical characteristics of parasitic diodes of each transistor were not nullified at the device level, the electrical characteristics of the parasitic diodes would have been multiply counted at the design layout level. The multiply-counted electrical characteristics of the parasitic diodes 230-240 would render the post-layout simulation incorrect.

In some embodiments, the step 130 can include extracting at least one electrical characteristic of the at least one parasitic diode from the design layout. Instead of extracting the electrical characteristics from the device level, the step 130 can extract the electrical characteristics of the parasitic diodes 230 and 240 from the database file of the design layout. For example, FIG. 2C illustrates several layers of the design layout of the transistor 200. The database file of the design layout can provide lengths $L_1$, $L_2$, widths $W_1$, $W_2$; areas $L_1 \times W_1$, $L_2 \times W_2$; perimeters $2(L_1+W_1)$, $2(L_2+W_2)$, and/or other dimensional parameters. The dimensional parameters can be applied to the device models embedded in the technology file 135 to generate resistances and/or capacitances of the parasitic diodes 230 and 240. Since being extracted from the design layout, the electrical characteristics that represent the correct number of the parasitic diodes 230 and 240 can be used for the post-layout simulation.

Referring again to FIG. 1, the method 100 can include performing a post-layout simulation (step 140). In some embodiments, the step 140 can be performed on a post-layout simulator, such as HSPICE® commercially available from SYNOPSYS, Inc. (San Jose, Calif.), SPECTRE® commercially available from CADENCE DESIGN SYSTEMS, Inc. (San Jose, Calif.), or other commercially-available post-layout simulators. In some embodiments, the post-layout simulation can be performed with the at least one electrical characteristic of the at least one parasitic diode that is extracted from the design layout. For example, the transistor 200 described above in conjunction with FIGS. 2A-2C is used. The post-layout simulation can be performed using the electrical characteristics of the parasitic diodes 230 and 240 that are extracted from the design layout.

Referring again to FIG. 1, the method 100 can include performing a layout versus schematic (LVS) check (step 150). In some embodiments, the step 150 can include extracting a layout netlist of the integrated circuit from the design layout. The extraction of the layout netlist is free from extracting the at least one parasitic diode. In some embodiments using the transistor 200, the step 150 can extract a layout netlist of the transistor 200. The layout netlist can include at least the nodes D, G, S, SUB, ISOW, and SUB of the transistor 200. The step 150, however, does not extract the parasitic diodes 230 and 240 from the design layout. If the parasitic diodes 230 and 240 were extracted from the design layout, the LVS check may be failed.

In some embodiments, the step 150 can include comparing the layout netlist and the schematic netlist that is generated by step 105. As noted, the schematic netlist associated with the schematic view of the transistor 200 shown in FIG. 2B can include the information of the nodes D, G, S, SUB, ISOW, and SUB. It is found that if the node information of the schematic netlist of the transistor 200 matches that of the layout netlist of the transistor 200, the LVS check is clean. In other embodiments, if the node information of the schematic netlist does not match that of the layout netlist, the design layout of the integrated circuit can be checked and/or modified.

In some embodiments, designers can use PDK files provided from different foundry companies to design integrated circuits. For example, a portion of the design layout of the integrated circuit can be generated from the PDK file described above in conjunction with FIG. 1 and another portion of the design layout of the integrated circuit can be generated from a legacy intellectual property (IP). The legacy IP can include a plurality of device model cards that are assigned to a plurality of devices. The plurality of devices can include a device having at least one parasitic diode that is associated with at least one isolation well. The legacy IP does not include information of the at least one parasitic diode.

In some embodiments using the PDK file described above in conjunction with FIG. 1 and the legacy IP, the step 150 can include blocking the legacy IP at the design layout level. As noted, a schematic netlist generated from the legacy IP does not include node information of the parasitic diodes. If the portion of the design layout generated from the legacy IP were not blocked, the node information of the parasitic diodes in the legacy IP would be extracted from the design layout. The extracted node information of the legacy IP including the parasitic diodes from the design layout does not match the schematic netlist generated from the legacy IP. The LVS check would be failed. By blocking the legacy IP at the design layout level, the step 150 merely extracting the node information from the PDK file that will match the node information of the schematic net list.

It is noted that the order of the steps 105, 110, 120, 130, 140, and 150 described above in conjunction with FIG. 1 is merely exemplary. The order of the steps can be modified. For example, the step 150 of performing the LVS check can be performed before the step 140 of performing the layout simulation. In some embodiments, one or more steps can be added in the method 100. For example, a step of performing a design rule check (DRC) can be performed after the step 120 of generating the design layout. The DRC may determine if there is a violation of the design rules associated with a given process. The scope of the present application is not limited thereto.

Figure 3:
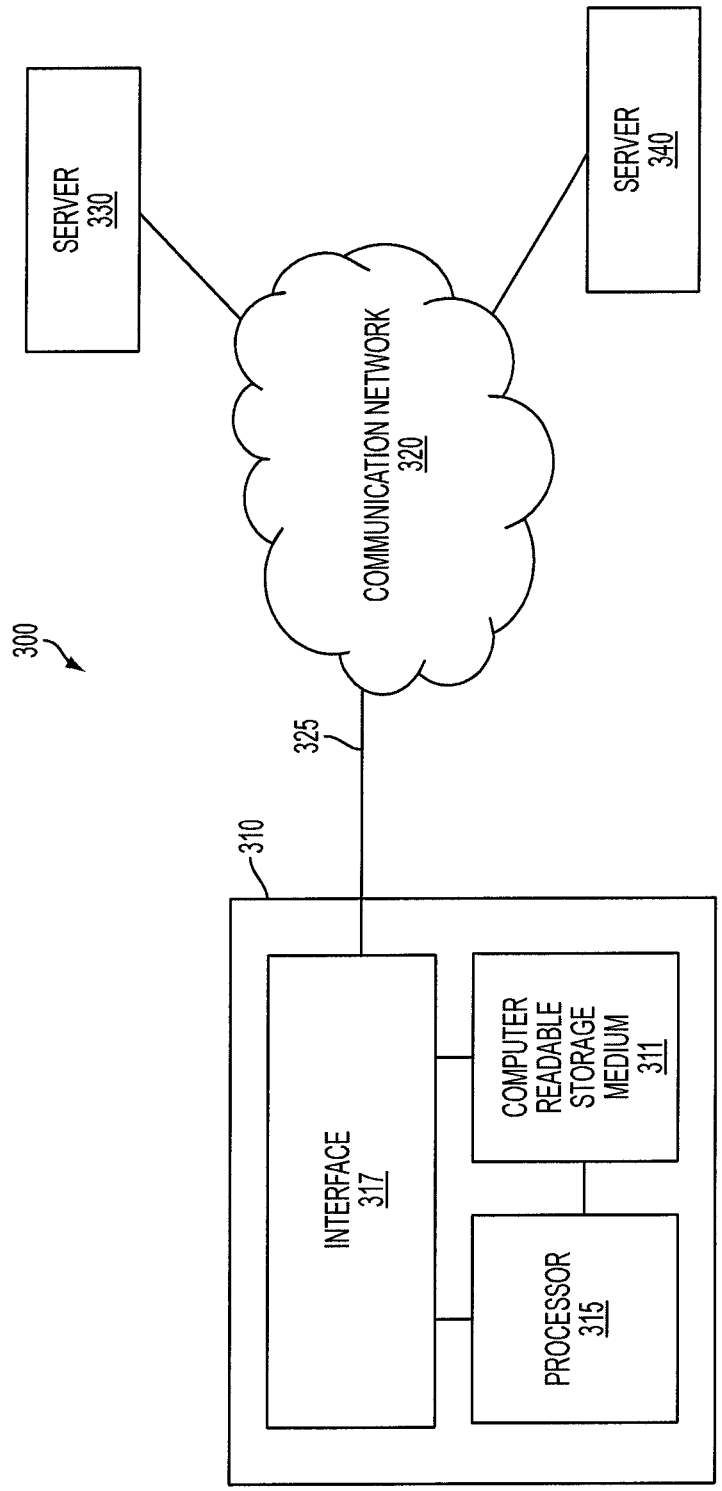
FIG. 3 is a schematic drawing illustrating an exemplary network system.

FIG. 3 is a schematic drawing illustrating an exemplary network system. In FIG. 3, a network system 300 can include a computer system 310 that can be coupled with serves 330 and 340 through a communication network 320. In some embodiments, the computer system 310 can include a computer readable storage medium 311 that can be encoded with a computer program code. The computer system 310 can include a processor 315 that can be electrically coupled with the computer readable storage medium 311. The processor 315 can be configured to execute the computer program code for designing integrated circuits. The processor 315 can be a central processing unit (CPU), a multi-processor, a distributed processing system, and/or any suitable processing unit.

In some embodiments, the processor 315 can be configured to perform a pre-layout simulation of an integrated circuit. The pre-layout simulation can be performed using a netlist generated from a PDK file. The PDK file can include a plurality of device model cards that are assigned to plurality of devices. The plurality of devices can include a device having at least one parasitic diode that is associated with at least one isolation well. The PDK file can include information of the at least one parasitic diode. The processor 315 can be further configured to generate a design layout of the integrated circuit corresponding to a result of the pre-layout simulation.

In some embodiments, the processor 315 can be further configured to generate a schematic netlist of the device. The schematic netlist can include at least one node that is electrically coupled with the at least one isolation well. In other embodiments, the processor 315 can be further configured to substantially null at least one electrical characteristic of the at least one parasitic diode at a device level. The processor 315 can be configured to extract at least one electrical characteristic of the at least one parasitic diode from the design layout. The processor 315 can be configured to perform a post-layout simulation. The post-layout simulation can be performed using the extracted at least one electrical characteristic. In still other embodiments, the processor 315 can be further configured to perform a layout versus schematic (LVS) check. The extraction of the LVS check can include extracting a layout netlist of the integrated circuit from the design layout, wherein the extraction of the layout netlist is free from extracting the at least one parasitic diode. The LVS check can further include comparing the layout netlist and the schematic netlist.

In some embodiments, the computer readable storage medium 311 can be an electronic, magnetic, optical, electromagnetic, infrared, a semiconductor system (or apparatus or device), and/or a propagation medium. For example, the computer readable storage medium 311 can include a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 311 can include a compact disk-read only memory (CD-ROM), a compact disk-read/write (CD-R/W), and/or a digital video disc (DVD).

In some embodiments, the computer program code stored in the computer readable storage medium 311 can include at least one software and/or circuit related data such as PDK files, netlists, electronic design automation (EDA) tools, LPE technology files, RC technology files, device models, post-layout simulators, pre-layout simulator, and/or any other software or data that are used for designing integrated circuits.

In some embodiments, the software can be stored in the serves 330 and 340 and accessed through the communication network 320. For example, the computer system 310 can be electrically coupled with the communications network 320 through a wireless and/or wired link 325. The communication network 325 can be, for example, a complete network, a subnet of a local area network, a company wide intranet, and/or the Internet. The computer system 310 may be identified on the communication network 325 by an address or a combination of addresses, such as a media address control (MAC) address associated with a network interface 317 and an internet protocol (IP) address. The network interface 317 can be, for example, a modem, a wireless transceiver, and/or one or more network interface cards (NICs).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of designing an integrated circuit, the method comprising:
    performing a pre-layout simulation of the integrated circuit, the pre-layout simulation being performed using a netlist generated from a process design kit (PDK) file, the PDK file including a first plurality of device model cards that are assigned to a first plurality of devices, the first plurality of devices including a first device having a well and at least one first isolation well between the well and a substrate, at least one first parasitic diode being associated with the at least one first isolation well, and the PDK file including information of the at least one first parasitic diode; and
    generating a design layout of the integrated circuit corresponding to a result of the pre-layout simulation.

2. The method of claim 1, further comprising:
    generating a schematic netlist of the first device, wherein the schematic netlist includes at least one node that is electrically coupled with the at least one first isolation well.

3. The method of claim 2, further comprising:
    substantially nulling at least one electrical characteristic of the at least one first parasitic diode at a device level;
    extracting at least one electrical characteristic of the at least one first parasitic diode from the design layout; and
    performing a post-layout simulation, the post-layout simulation being performed using the extracted at least one electrical characteristic.

4. The method of claim 3, further comprising:
    performing a layout versus schematic (LVS) check, comprising:
        extracting a layout netlist of the integrated circuit from the design layout, wherein extracting the layout netlist is free from extracting the at least one first parasitic diode; and
        comparing the layout netlist and the schematic netlist.

5. The method of claim 4, wherein the LVS check further comprises:
    blocking a portion of the design layout of the integrated circuit that is generated from a legacy intellectual property (IP), wherein the legacy IP includes a second plurality of device model cards that are assigned to a second plurality of devices, the second plurality of devices include a second device having at least one second parasitic diode that is associated with at least one second isolation well, the legacy IP does not include information of the at least one second parasitic diode.

6. The method of claim 1, wherein the at least one first parasitic diode includes at least one of a parasitic diode resembling the at least one first isolation well adjoining the substrate, a parasitic diode resembling the at least one first isolation well adjoining the well, and a parasitic diode resembling the at least one first isolation well adjoining a third isolation well.

7. The method of claim 6, wherein the at least one first parasitic diode resembles the well adjoining the at least one first isolation well, and the information of the at least one first parasitic diode comprises at least one of an estimated length of the well, an estimated width of the well, an estimated perimeter of the well, an estimated area of the well, and an estimated area of the well.

8. The method of claim 6, wherein the at least one first parasitic diode resembles the at least one first isolation well adjoining the substrate in which the at least one first isolation well is disposed, and the information of the at least one first parasitic diode comprises at least one of an estimated length of the at least one first isolation well, an estimated width of the at least one first isolation well, an estimated perimeter of the at least one first isolation well, and an estimated area of the at least one first isolation well.

9. A method of designing an integrated circuit, the method comprising:
    performing a pre-layout simulation of the integrated circuit on a pre-layout simulator, the pre-layout simulation being performed using a netlist generated from a process design kit (PDK) file, the PDK file including a first plurality of device model cards that are assigned to a first plurality of devices, the first plurality of devices including a first device having a well and at least one first isolation well between the well and a substrate, at least one first parasitic diode being associated with the at least one first isolation well, and the PDK file including information of the at least one first parasitic diode;
    generating a design layout of the integrated circuit corresponding to a result of the pre-layout simulation;
    substantially nulling at least one electrical characteristic of the at least one first parasitic diode at a device level;
    extracting at least one electrical characteristic of the at least one first parasitic diode from the design layout; and
    performing a post-layout simulation on a post-layout simulator, the post-layout simulation being performed using the extracted at least one electrical characteristic.

10. The method of claim 9, further comprising:
    generating a schematic netlist of the first device, wherein the schematic netlist includes at least one node that is electrically coupled with the at least one first isolation well; and performing a layout versus schematic (LVS) check, comprising:
    extracting a layout netlist of the integrated circuit from the design layout, wherein extracting the layout netlist is free from extracting the at least one first parasitic diode; and
    comparing the layout netlist and the schematic netlist.

11. The method of claim 10, wherein the LVS check further comprises:
    blocking a portion of the design layout of the integrated circuit that is generated from a legacy intellectual property (IP), wherein the legacy IP includes a second plurality of device model cards that are assigned to a second plurality of devices, the second plurality of devices include a second device having at least one second parasitic diode that is associated with at least one second isolation well, the legacy IP does not include information of the at least one second parasitic diode.

12. The method of claim 9, wherein the at least one first parasitic diode includes at least one of a parasitic diode resembling the at least one first isolation well adjoining the substrate, a parasitic diode resembling the at least one first isolation well adjoining the well, and a parasitic diode resembling the at least one first isolation well adjoining a third isolation well.

13. The method of claim 12, wherein the at least one first parasitic diode resembles the well adjoining the at least one first isolation well adjoining the well, and the information of the at least one first parasitic diode comprises at least one of an estimated length of the well, an estimated width of the well, an estimated perimeter of the well, an estimated area of the well, and an estimated area of the well.

14. The method of claim 12, wherein the at least one first parasitic diode resembles the at least one first isolation well adjoining the substrate in which the at least one first isolation well is disposed, and the information of the at least one first parasitic diode comprises at least one of an estimated length of the at least one first isolation well, an estimated width of the at least one first isolation well, an estimated perimeter of the at least one first isolation well, and an estimated area of the at least one first isolation well.

15. A computer system comprising:
    a computer readable storage medium being encoded with a computer program code; and
    a processor electrically coupled with the computer readable storage medium, the processor being configured to execute the computer program code for designing an integrated circuit, the computer program code being arranged to cause the processor to:
        perform a pre-layout simulation of the integrated circuit, the pre-layout simulation being performed using a netlist generated from a process design kit (PDK) file, the PDK file including a first plurality of device model cards that are assigned to a first plurality of devices, the first plurality of devices including a first device having a well and at least one first isolation well between the well and a substrate, at least one first parasitic diode being associated with the at least one first isolation well, and the PDK file including information of the at least one first parasitic diode; and
        generate a design layout of the integrated circuit corresponding to a result of the pre-layout simulation.

16. The computer system of claim 15, wherein the processor is further configured to:
    generate a schematic netlist of the first device, wherein the schematic netlist includes at least one node that is electrically coupled with the at least one first isolation well.

17. The computer system of claim 16, wherein the process is further configured to:
    substantially null at least one electrical characteristic of the at least one first parasitic diode at a device level;
    extract at least one electrical characteristic of the at least one first parasitic diode from the design layout; and
    perform a post-layout simulation, the post-layout simulation being performed using the extracted at least one electrical characteristic.

18. The computer system of claim 17, wherein the process is further configured to:
    perform a layout versus schematic (LVS) check, comprising:
        extracting a layout netlist of the integrated circuit from the design layout, wherein extracting the layout netlist is free from extracting the at least one first parasitic diode; and
        comparing the layout netlist and the schematic netlist.

19. The computer system of claim 18, wherein the LVS check further comprises:
    blocking a portion of the design layout of the integrated circuit that is generated from a legacy intellectual property (IP), wherein the legacy IP includes a second plurality of device model cards that are assigned to a second plurality of devices, the second plurality of devices include a second device having at least one second parasitic diode that is associated with at least one second isolation well, the legacy IP does not include information of the at least one second parasitic diode.

* * * * *